(12) United States Patent
Kawachi et al.

(10) Patent No.: US 9,013,096 B2
(45) Date of Patent: Apr. 21, 2015

(54) LIGHT EMITTING MODULE

(75) Inventors: Hideharu Kawachi, Hyogo (JP);
Shigetsugu Sumiyama, Osaka (JP);
Satoshi Fukano, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 120 days.

(21) Appl. No.: 13/816,752

(22) PCT Filed: Sep. 29, 2011

(86) PCT No.: PCT/JP2011/072328
§ 371 (c)(1),
(2), (4) Date: Feb. 13, 2013

(87) PCT Pub. No.: WO2012/056848
PCT Pub. Date: May 3, 2012

(65) Prior Publication Data
US 2013/0134866 A1    May 30, 2013

(30) Foreign Application Priority Data

Oct. 25, 2010    (JP) .................................. 2010-239103

(51) Int. Cl.
*H05B 33/06*    (2006.01)
*H05B 33/10*    (2006.01)
*H01L 51/52*    (2006.01)

(52) U.S. Cl.
CPC ............... *H05B 33/06* (2013.01); *H05B 33/10* (2013.01); *H01L 51/5203* (2013.01)

(58) Field of Classification Search
None
See application file for complete search history.

(56) References Cited

U.S. PATENT DOCUMENTS

| | | | |
|---|---|---|---|
| 2008/0143920 A1 | 6/2008 | Back et al. | |
| 2008/0164481 A1 | 7/2008 | Tai et al. | |
| 2009/0302731 A1 | 12/2009 | Takamura | |
| 2010/0244749 A1 | 9/2010 | Okawa et al. | |
| 2013/0187186 A1* | 7/2013 | Popp | 257/99 |

FOREIGN PATENT DOCUMENTS

| | | |
|---|---|---|
| JP | 2003-051385 A | 12/2003 |
| JP | 2008-153217 A | 7/2008 |

(Continued)

OTHER PUBLICATIONS

Chinese Office Action for corresponding Chinese Patent Application No. 201180051707.X dated Aug. 25, 2014, with English language translation.

(Continued)

*Primary Examiner* — Britt D Hanley
(74) *Attorney, Agent, or Firm* — Renner, Otto, Boisselle & Sklar, LLP

(57) ABSTRACT

The light emitting module includes: a light emitting panel which has feeding electrodes each of which being electrically connected to a positive electrode or a negative electrode of the light emitting unit; a circuit board which is electrically connected to the feeding electrodes and is configured to supply electric power to the light emitting unit; and a case unit in which the light emitting panel and the circuit board are housed. The feeding electrodes are arranged at a peripheral region of the light emitting panel. The electrical connection between the feeding electrode and the circuit board (or the land-board) is obtained by a wiring which is elongated from the center region to the peripheral region of the light emitting panel.

9 Claims, 6 Drawing Sheets

(56) References Cited

FOREIGN PATENT DOCUMENTS

| | | |
|---|---|---|
| JP | 2008-170509 A | 7/2008 |
| JP | 2009-295487 A | 12/2009 |
| JP | 2010-003600 A | 1/2010 |
| JP | 2010-232286 A | 10/2010 |
| WO | 2009/109183 A1 | 9/2009 |

OTHER PUBLICATIONS

International Search Report for corresponding International Application No. PCT/JP2011/072328 mailed Dec. 27, 2011.

PCT/ISA/237 for corresponding International Application No. PCT/JP2011/072328 dated Dec. 27, 2011.

* cited by examiner

A

B

A

B

A

B

LIGHT EMITTING MODULE

TECHNICAL FIELD

The present invention relates to a light emitting module having a light emitting panel.

BACKGROUND ART

An electroluminescence (EL) device includes: a transparent substrate; and a light emitting unit formed on the transparent substrate, where the light emitting unit includes a positive electrode, a negative electrode and a light emitting layer provided therebetween. When a voltage is applied between the electrodes, an electron and a hole, which serve as carriers, are injected into the light emitting layer and recombine with each other to generate an exciton, and thereby the EL device emit light.

In general, the EL devices can be classified into an organic EL device and an inorganic EL device. The organic EL device employs an organic material for a luminescence material (such as a fluorescent material and a phosphorescent material) of the light emitting layer. The inorganic EL device employs an inorganic material for a luminescence material. The organic EL device has advantages that: it can emit a high-brightness light with a low applying voltage; it can select various of emission colors by changing the types of luminescence materials; and it can be easily produced in a light emitting panel of planar shape. Because of these advantages, recently, the organic EL device is interested to be applied for a lighting apparatus.

The light emitting unit has a transparent electrode formed of ITO, which has a comparatively large in-plane resistance. Therefore, the potential gradient of the transparent electrode with respect to the light emitting layer becomes large. This causes a dispersion of brightness in a plane of the light emitting layer. In order to suppress such the dispersion of brightness, it has been developed such a planar light emitting device that includes a plurality of feeding electrodes for leading out the positive electrode and the negative electrode outward the light emitting panel. With this configuration, the potential gradient with respect to the light emitting layer can be lowered (for example, refer to Japanese patent application publication 2010-232286A).

FIGS. 7A and 7B show an example of a light emitting module employing such the planar light emitting panel. The light emitting module 101 includes: a light emitting panel 103 having a light emitting unit 102; a circuit board 104 for supplying electric power to the light emitting unit 102 of the light emitting panel 103; and a case unit 105 in which the light emitting panel 103 and the circuit board 104 are housed. In the light emitting module, a plurality of feeding electrodes (103a, 103b) are arranged along a periphery of the light emitting panel 103. Each of the plurality of feeding electrodes (103a, 103b) is electrically connected to either a positive electrode or a negative electrode of the light emitting unit 102. The case unit 105 includes a case body 150 and a cover 151. The light emitting panel 103 is supported by the case body 150. The cover 151 is arranged at a non-emitting side (at a reverse side to a side on which the light emitting panel 103 is arranged) of the case body 150. The cover 151 is adapted to protect the circuit board 104 and the like. Some of feeding electrodes from among the plurality of feeding electrodes (103a, 103b) are electrically connected to the circuit board 104 by wirings 107. The feeding electrodes having same polarity are connected one another by wirings 108.

When connecting these electrodes, a wire bonding method is adopted by which a wire formed of such as aluminum is used for the wiring. In general, in the wire boding method, the wiring (107, 108) is provided in an arch-shape to have some slack as shown in FIG. 8A in order to avoid a breaking of the wire caused of such as thermal expansion and contraction of the wire.

With regard to such a light emitting module, it has been desired to increase the light emitting area while streamlining the module shape. One way of increasing the light emitting area is to increase the dimension of the light emitting layer. In order to do so, the plurality of feeding electrodes are needed to be arranged at the periphery of the light emitting panel 103 as shown in FIG. 7A, 7B. However, when connecting, by the wirings 108 through the wire bonding method, the feeding electrodes 103a to each other and the feeding electrodes 103b to each other which are provided at the periphery of the light emitting panel 103, the module is required to have sufficient space for accommodating the wire (each of the wires is provided in an arch-shape). Therefore, as shown in FIG. 8A, the cover 151 of the module is required to be designed to have a predetermined thickness (sufficient "height") at the periphery thereof. In this configuration, a user is likely to feel that the module is comparatively thick (user is likely to receive a thickness impression). In order to suppress such the thickness impression, periphery of the cover 151 may be chamfered. However in this case, as shown in FIG. 8B, the wiring 108 possibly comes into contact with the inner surface of the cover 151 to be damaged.

DISCLOSURE OF INVENTION

The present invention is developed in view of above problem, and it is an object of the present invention to provide a light emitting module having a streamlined shape which gives a reduced thickness impression of the case unit for housing the light emitting panel (i.e. which has reduced thickness of the light emitting module at the periphery).

In order to achieve the above object, a light emitting module of the present invention comprising: a light emitting panel which has a light emitting unit and a plurality of feeding electrodes, said light emitting unit comprising a positive electrode, a negative electrode and a light emitting layer provided therebetween, each of said plurality of feeding electrodes being electrically connected to either said positive electrode or said negative electrode; a circuit board which is electrically connected to said plurality of feeding electrodes and is configured to supply electric power to said light emitting unit; and a case unit in which said light emitting panel and said circuit board are housed, wherein said plurality of feeding electrodes are arranged at a peripheral region of said light emitting panel, wherein said circuit board is situated nearer the center in relation to the peripheral region of said light emitting panel, and wherein the electrical connection between said feeding electrode and said circuit board is obtained by a wiring which is elongated in the direction from a center region to a peripheral region of said light emitting panel.

In the light emitting module, it is preferred that wherein said plurality of feeding electrodes are arranged in such a manner that the feeding electrodes having same polarity are not arranged adjacent one another.

In the light emitting module, it is preferred that wherein circuit components are mounted on said circuit board, said circuit components being arranged so as to be gathered at a center region of said light emitting panel.

In the light emitting module, it is preferred that wherein said light emitting module further comprises a land-board for wiring connection, said land-board being situated nearer the center in relation to said plurality of feeding electrodes, and wherein the electrical connection between said feeding electrode and said circuit board is obtained through said land-board.

In the light emitting module, it is preferred that wherein said circuit board and said land-board are provided separately from each other.

In the light emitting module, it is preferred that wherein said plurality of feeding electrodes are arranged along a side of said light emitting panel, and wherein said plurality of feeding electrodes and said circuit board are electrically connected by a plurality of said wirings, each and every of said plurality of wirings being elongated along a direction orthogonal to the arrangement direction of said plurality of feeding electrodes.

In the light emitting module, it is preferred that wherein said case unit comprises a case body to which said light emitting panel and said circuit board are attached, said case body being formed with a plurality of openings at positions corresponding to said plurality of feeding electrodes of said light emitting panel, wherein said circuit board is arranged on said case body of a reverse side to a side to which said light emitting panel is attached, said circuit board being situated nearer the center in relation to said plurality of openings, and wherein each of wirings which are connected to the feeding electrodes is arranged so as to pass through such one of said plurality of openings that is formed for the concerned feeding electrode.

In the light emitting module, it is preferred that wherein said light emitting module further comprises a land-board for wiring connection, said land-board being arranged on said case body of a side to which said circuit board is attached, said land-board being situated nearer the center in relation to said plurality of openings, wherein each of said plurality of feeding electrodes is electrically connected to said land-board by a wiring, said wiring being elongated along a direction orthogonal to the arrangement direction of said plurality of feeding electrodes, said wiring being arranged so as to pass through such one of said plurality of openings that is formed for the concerned feeding electrode, and wherein said land-board is electrically connected to said circuit board by a wiring which is elongated along a direction orthogonal to the arrangement direction of said plurality of feeding electrodes.

In the light emitting module, it is preferred that wherein said light emitting unit is an electroluminescence device which comprises a planar positive electrode, a planar negative electrode and a light emitting layer provided therebetween.

According to the present invention, the electrical connection between the feeding electrode and the circuit board is obtained by a wiring which is elongated from a center region to a peripheral region of the light emitting panel. Therefore, the top portion of the wiring is located nearer the center in relation to the peripheral region of the light emitting panel. With this configuration, the wiring becomes less possible to be contacted with the inner surface of the cover even when using the cover having a chamfered periphery. Therefore, the present invention can suppress the thickness impression of the light emitting module, and can provide the light emitting module of a streamlined shape.

DESCRIPTION OF EMBODIMENTS

Figure 1:
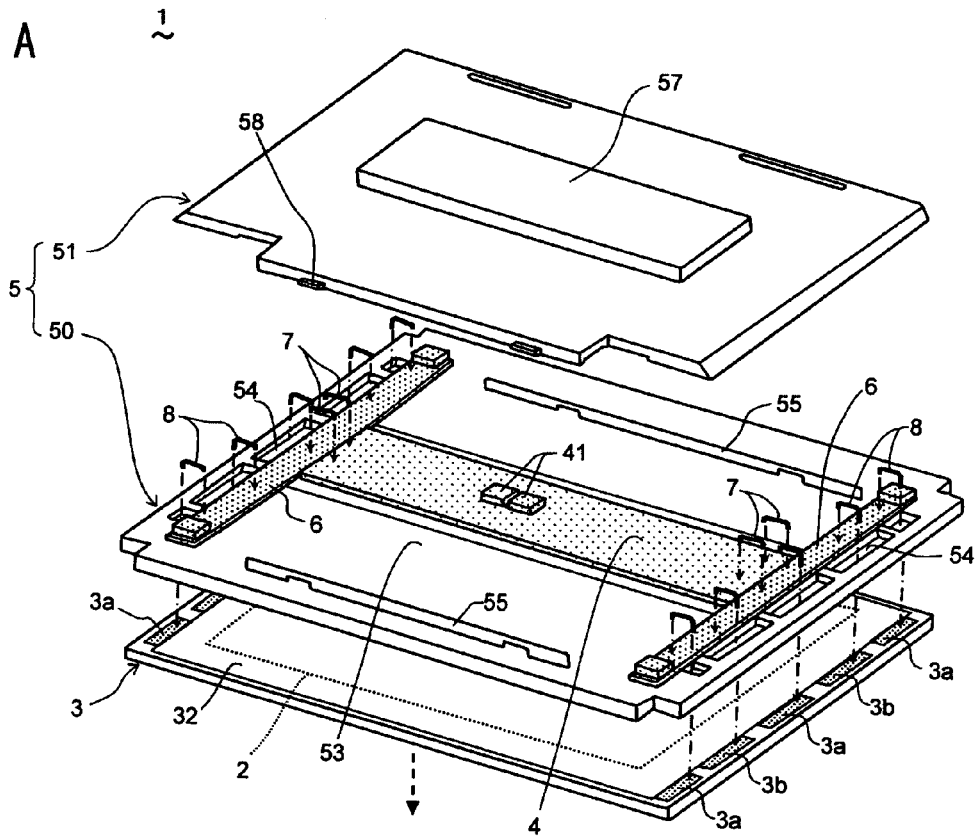
FIG. 1A is an exploded perspective view of a light emitting module according to an embodiment of the present invention.
FIG. 1B is a partially exploded perspective view of the light emitting module.
Figure 1:
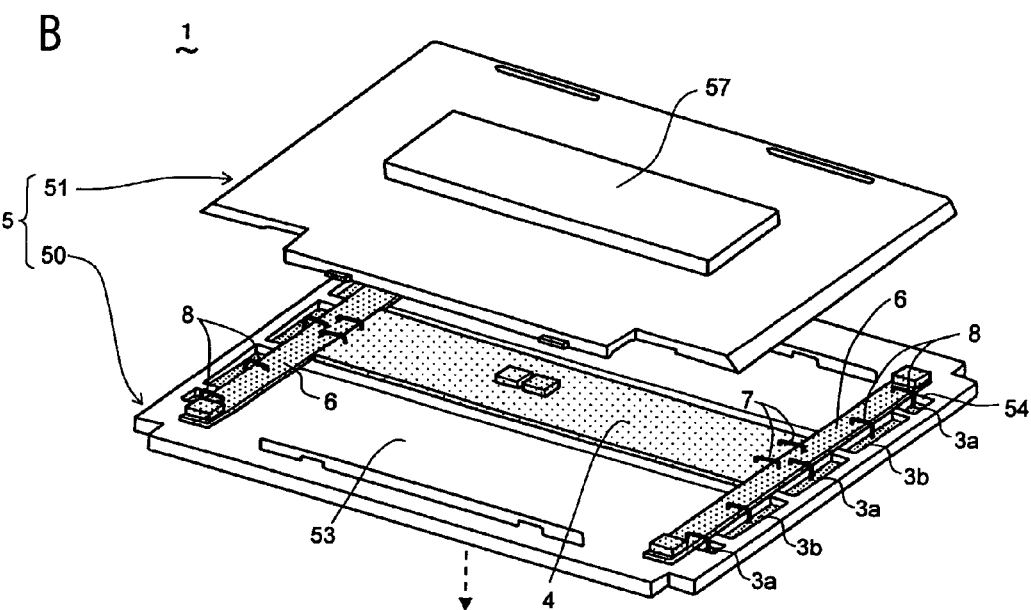

A light emitting module according to an embodiment of the present invention is described with reference to FIGS. 1 to 5. As shown in FIG. 1A and FIG. 1B, a light emitting module 1 of the present embodiment includes: a light emitting panel 3 having a light emitting unit 2; a circuit board 4 for supplying electric power to the light emitting unit 2; and a case unit 5 in which the light emitting panel 3 and the circuit board 4 are housed. The light emitting unit 2 is composed of a positive electrode 2a, a negative electrode 2c and a light emitting layer 2b provided therebetween (as described in detail later). In the present embodiment, the light emitting unit is composed of an organic EL device. In the present embodiment, each of the positive electrode 2a, the light emitting layer 2b, and the negative electrode 2c is formed in a planar shape (a rectangular shape in a planar view). The light emitting panel 3 has a plurality of feeding electrodes (3a, 3b) each of which is electrically connected to either the positive electrode 2a or the negative electrode 2c of light emitting unit 2. In other words, the light emitting panel 3 has a plurality of first feeding electrodes 3a each of which is electrically connected to the positive electrode 2a and a plurality of second feeding electrodes 3b each of which is electrically connected to the negative electrode 2c. The plurality of feeding electrodes (3a, 3b) are arranged at a peripheral region of the light emitting panel 3, and are electrically connected to the circuit board 4. In the present embodiment, the plurality of feeding electrodes (3a, 3b) are arranged along a side (sides) of the light emitting panel 3. The circuit board 4 is arranged nearer the center in relation to the peripheral region of the light emitting panel 3. In the present embodiment, the light emitting module 1 is configured to emit light in the direction of dashed arrow shown in the figures. In the following explanation, the direction of the dashed arrow is referred to as "emitting direction", and the directly opposite direction of the dashed arrow is referred to as "non-emitting direction".

The light emitting module 1 includes a land-board for wiring connection (land-board) 6. Especially in the present embodiment, the light emitting module includes a pair of land-boards 6. The land-board 6 is arranged nearer the center in relation to the plurality of feeding electrodes (3a, 3b). Each of the feeding electrodes (3a, 3b) is electrically connected to the circuit board 4 via the land-board 6. The electrical connection between the circuit board 4 and the land-board 6 is obtained by a wiring 7. The electrical connections between the land-board 6 and the feeding electrodes (3a, 3b) are obtained by the wirings 8 (8a, 8b), respectively. In the present example, the first feeding electrode 3a is defined as an electrode which is connected to the positive electrode 2a of the light emitting unit 2. Also, the second feeding electrode 3b is defined as an electrode which is connected to the negative electrode 2c of the light emitting unit 2. Each of the wirings (7, 8) is elongated in the direction from a center region to a peripheral region of the light emitting panel 3. In the present embodiment, each of the wirings 8 is elongated in the direction orthogonal to the arrangement direction of the feeding electrodes (3a, 3b) to which the wiring 8 in question is connected. The wiring 7 also is elongated in the direction orthogonal to the arrangement direction of the feeding electrodes (3a, 3b).

The case unit 5 includes: a case body 50 for supporting the light emitting panel 3; and a cover 51 for protecting the circuit board 4 and the like. The cover 51 is arranged at the non-emitting direction with respect to the case body 50. The shape of the light emitting panel 3 is determined properly depending on the intended use of the light emitting module 1. The case unit 5 is formed to have a shape according to the shape of the light emitting panel 3. In the present example, the light emitting panel 3 is formed in an elongated rectangular shape as shown in figures. The case unit 5 can be made of: plastics material such as ABS resin, acrylic resin, polystyrene resin or the like; or metal material such as aluminum plate with processing an insulation treatment on its surface.

Figure 4:
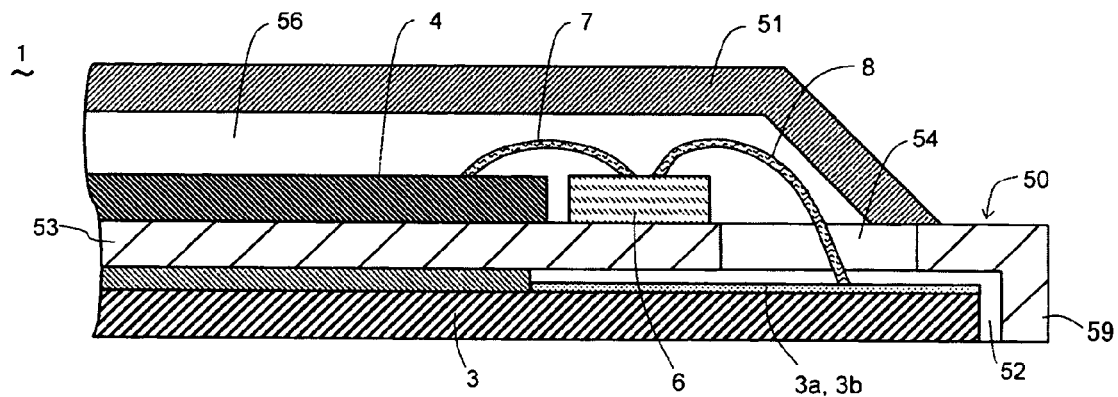
FIG. 4 is a schematic sectional side view showing around a peripheral region of the light emitting module.

The case body 50 is formed in a tin-shape having a depression 52 which is opened in the emitting direction (refer to FIG. 4). The light emitting panel 3 is fit into the depression 52. The bottom of the depression 52 includes a supporting portion 53 for supporting the light emitting panel 3 and a plurality of openings 54 for exposing therethrough the plurality of feeding electrodes (3a, 3b) to the non-emitting directional side. The openings 54 are formed at the positions corresponding to the feeding electrodes (3a, 3b), respectively. The light emitting panel 3 is attached to the supporting portion 53 by an adhesion member (not shown in figures). The adhesion member is preferred to serve as a buffer, filler, and the like. The circuit board 4 and the land-board 6 are arranged on the non-emitting directional side surface of the supporting portion 53. The circuit board 4 is arranged on a middle region of the supporting portion 53. The circuit board 4 is arranged parallel with the longitudinal direction of the supporting portion 53. The pair of land-boards 6 are arranged at both ends of the circuit board 4 so as to place the circuit board 4 between the pair of land-boards 6. Each of the land-boards 6 is arranged orthogonal to the longitudinal direction of the supporting portion 53. Each of the circuit board 4 and the land-boards 6 is fixed to the supporting portion 53 by such as an acrylic double-stick tape in which a core material is contained that has a superior heat resistance property, a superior moisture resistance property and a superior stress relaxation property. The supporting portion 53 is provided with an engaging part 55 with which the cover 51 is engaged.

In other words, the case body 50 has a peripheral wall 59 (refer to FIG. 4) formed at the outer periphery of the rectangular plate shaped supporting portion 53 so that the peripheral wall 59 surrounds the supporting portion 53. The depression 52 is composed by a space surrounded by the supporting portion 53 and the peripheral wall 59. The light emitting panel 3 is attached to the depression 52. The plurality of openings 54 are formed at the longitudinal both ends of the supporting portion 53 at the positions corresponding to the feeding electrodes (3a, 3b) of the light emitting panel 3. The openings 54 are formed side-by side along the side edge of the supporting portion 53. The circuit board 4 and the land-board 6 are arranged on the case body 50 of a reverse side to a side to which the light emitting panel 3 is attached (that is, arranged on the non-emitting directional side surface of the case body 50). The circuit board 4 and the land-boards 6 are arranged at positions of closer to the center than the positions of the plurality of openings 54 of the case body 50. The circuit board 4 is arranged at a position of closer to the center than the arrangement position of the land-board 6. The land-board 6 is arranged so that the longitudinal direction thereof extends along the arrangement direction of the plurality of openings 54.

The cover 51 is formed in a tin-shape having a depression 56 which is opened in the emitting direction (refer to FIG. 4). This depression 56 gives a space for housing the circuit board 4, the land-board 6, and the wirings (7, 8) therein. The outer periphery of the cover 51 is chamfered so as to be inclined toward the edge of the cover 51. The cover 51 has a further depressed recess 57 formed at a center region thereof. The recess 57 gives a space for housing therein a variety of circuit components 41 mounted on the circuit board 4. The cover 51 is formed at the side face thereof with an engaging part 58 with which the engaging part 55 of the case body 50 is engaged. The cover 51 is formed to have a dimension such that all of the plurality of openings 54 formed at the supporting portion 53 are covered by the cover 51 when the engaging parts 58 formed at both side faces are engaged with the engaging parts 55 (refer to FIG. 5).

Figure 2:
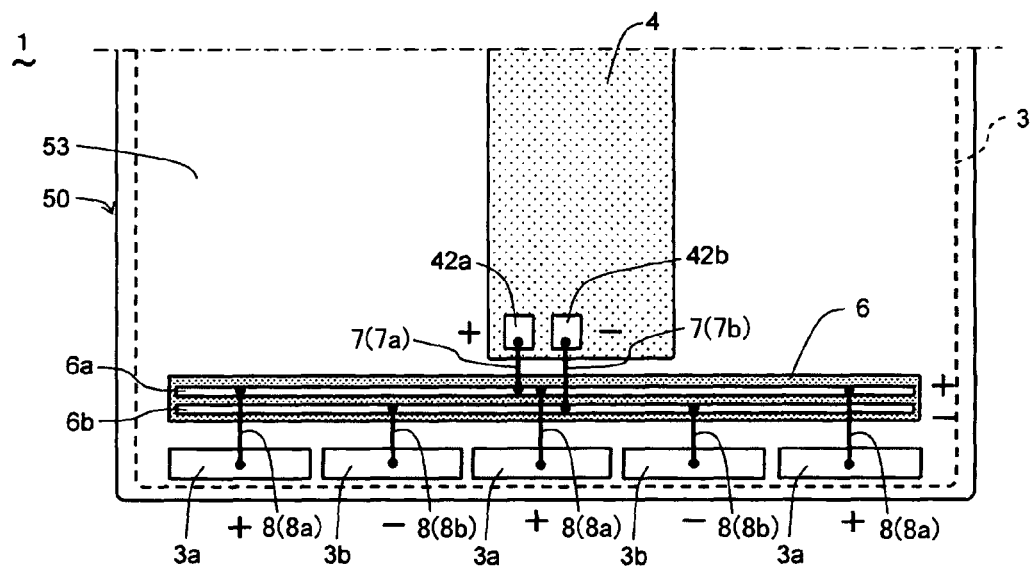
FIG. 2 is a schematic top view showing around a peripheral region of the light emitting module.

The circuit board 4 is formed of a common printed wiring board which is provided with printed circuits (not shown in figures) and terminals (42a, 42b) adapted to be connected to the land-board 6 by the wirings 7 (refer to FIG. 2). The wiring board is preferred to be formed of a substrate having a flame resistance property and a low conductive property, such as a glass fiberboard (for example, FR-4 (FLAME Retardant Type 4)) made by impregnating a fiberglass cloth with epoxy resin and then hardened. The circuit board 4 is provided thereon with a various kinds of circuit components 41 such as a dimming control circuit configured to receive a dimming control signal from a dimming device or the like provided outside the light emitting module 1, a current control circuit configured to control the electric current supplied to the light emitting panel 3, and the like. Each of the terminals (42a, 42b) of the printed circuits is preferably plated with such as gold. The circuit board 4 is provided thereon with a connector (not shown in figures) configured to receive electric power from outside and to connect with another light emitting module 1. The cover 51 is formed with a terminal opening (not shown in figures) thorough which the connector is exposed.

The land-board 6 is formed of a common printed wiring board as similar with the circuit board 4. As shown in FIG. 2, the land-board 6 is provided with a positive electrode line 6a and a negative electrode line 6b each of which is formed parallel with the longitudinal direction of the land-board 6. That is, the land-board 6 is arranged such that each of the positive electrode line 6a and the negative electrode line 6b is elongated along the arrangement direction of the feeding electrodes (3a, 3b). The positive electrode line 6a is electrically connected to the positive-side terminal 42a of the circuit board 4 by a wiring 7a, and the negative electrode line 6b is electrically connected to the negative-side terminal 42b of the circuit board 4 by a wiring 7b. As described above, each of the wirings 7 (7a, 7b) is arranged so as to extend from the renter region of the light emitting panel 3 to the peripheral region of the light emitting panel 3. The positive electrode line 6a is electrically connected to the first feeding electrode 3a by the wiring 8a, and the negative electrode line 6b is electrically connected to the second feeding electrode 3b by the wiring 8b. As described above, each of the wirings 8 (8a, 8b), which connects between the feeding electrode (3a, 3b) and the positive electrode line 6a or the negative electrode line 6b of the land-board 6, is arranged so as to extend from the center region of the light emitting panel 3 to the peripheral region of the light emitting panel 3. In the present embodiment, each of the wirings 8 (8*a*, 8*b*) extends in the direction orthogonal to the arrangement direction of the feeding electrodes (3*a*, 3*b*) so as to pass through one of the plurality of openings 54 (refer to FIG. 1B). The positive electrode line 6*a* and the negative electrode line 6*b* may be coated with an insulation material with exposing only the terminals (not shown in figured).

Figure 3:
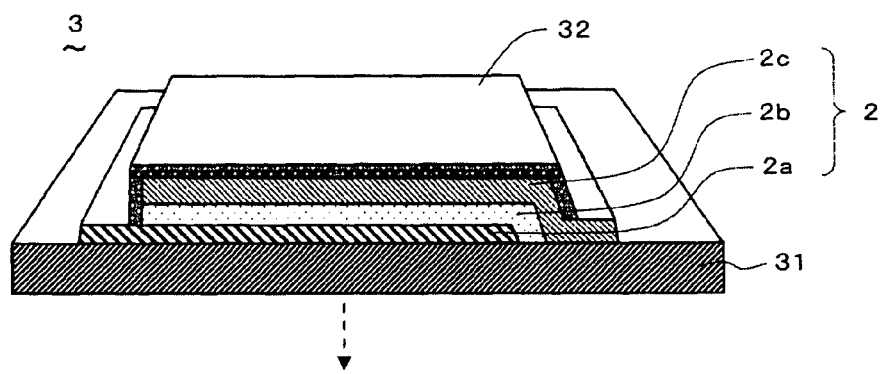
FIG. 3 is a schematic sectional side view of a light emitting panel included in the light emitting module.

The configuration of the light emitting panel 3 is explained below with reference to FIG. 1A, FIG. 1B and FIG. 3. The light emitting panel 3 is composed of: a substrate 31 having a light transmissive property; the light emitting unit 2 formed on the substrate 31; and a sealing member which coats the outer side of the light emitting unit 2. The light emitting unit 2 is composed of: the positive electrode 2*a* formed of a transparent conductive film; the light emitting layer 2*b* having a light emission capability; and the negative electrode 2*c* having a light-reflective property, wherein which are stacked on the substrate 31 in this order.

The substrate 31 is formed of a translucent glass such as a soda-lime glass or an alkali-free glass, or formed of a translucent resin material. The substrate 31 is formed in a rectangular plate shape. The substrate 31 may be provided therein with a phosphor which is excited by the light of the light emitting layer 2*b* and to emit light having longer wavelength than the light of the light emitting layer 2*b*.

The positive electrode 2*a* is adapted to inject a hole in the light emitting layer 2*b*. The positive electrode 2*a* is made of an electrode material such as metal, alloy, conductive compound or mixture of them having a large work function, and preferably of the material having a work function of 4 [eV] or more. It is preferred that the electrode material of the positive electrode 2*a* is such a translucent conductive material of ITO (indium tin oxide), $SnO_2$ (tin oxide), ZnO (zinc oxide) or the like. The positive electrode 2*a* is formed on the surface of the substrate 31 by deposing and patterning these electrode materials through the vacuum evaporation method, the sputtering method, or the like.

The light emitting layer 2*b* is formed by using such as anthracene, naphthalene, pyrene, tetracene, tris-(8-hydroxyquinolinate)-aluminum complex, tris-(4-methyl-8-quinolinate)-aluminum complex or distyrylarylene derivative; compound or polymer material which includes above luminescent element as a radical; various kinds of fluorochrome; or mixture of them. In the present example, the light emitting panel 3 employs organic material for the light emitting layer 2*b*, but the present invention is not limited thereto. Inorganic material may be employed for the light emitting layer 2*b*. The light emitting layer 2*b* is formed on the surface of the positive electrode 2*a* by deposing and patterning the above described material through the vacuum evaporation method or the like. The light emitting layer 2*b* may include a plurality of layers formed of different materials, and also may further include a buffer layer or the like for adjusting the potential between these layers.

The negative electrode 2*c* is adapted to inject an electron in the light emitting layer 2*b*. The negative electrode 2*c* is made of an electrode material of metal, alloy, conductive compound or mixture of them having a small work function, and preferably of the material having a work function of 5 [eV] or less. It is preferred that the electrode material of the negative electrode 2*c* is such a reflective conductive material of lithium, aluminum, aluminum-lithium alloy, mixture of magnesium and silver, mixture of Al and $Al_2O_3$, mixture of Al and LiF, or the like. The negative electrode 2*c* is formed by similar method with the positive electrode 2*a*.

A hole injection/transport layer (not shown in figures) for facilitating the hole injecting effect from the positive electrode 2*a* to the light emitting layer 2*b* is preferably provided between the positive electrode 2*a* and the light emitting layer 2*b*. An electron injection/transport layer (not shown in figures) for facilitating the electron injecting effect from the negative electrode 2*c* to the light emitting layer 2*b* is preferably provided between the light emitting layer 2*b* and the negative electrode 2*c*.

The light emitting panel 3 is formed into the above configuration, and the light emitting layer 2*b* emits light when a predetermined electric power is supplied from the circuit board 4. The light emitted from the light emitting layer 2*b* is (reflected by the negative electrode 2*c* and is) transmitted through the positive electrode 2*a*, and is extracted toward outward of the light emitting panel 3 from the substrate 31 side. The light emitting panel 3 is preferably provided on its emitting surface (on the surface of the light emitting panel 3 of the emitting directional side) with a protection layer made of acrylic resin or the like for protecting the substrate 31 from being damaged or stained, a diffusion layer for improving the light extracting efficiency from the substrate 31 side, and the like (not shown in figures).

In general, transparent electrode material (such as ITO) has a comparatively small electric conductivity as a conducting material. Therefore, in the light emitting panel 3 which usually is desired to have a larger dimension of the light emitting unit 2, the voltage is likely to gradually drop with distance from the power feeding point. It may cause a dispersion of the brightness in the light emitting unit 2. In order to resolve this problem, the present embodiment further includes an auxiliary electrode of a patterned metal which can suppress the voltage drop in the electrode made of such as ITO.

The auxiliary electrode is formed so as to have an opening at a position where the light emitting layer 2*b* is formed, in order not to disturb the light emission toward the substrate 31 side. The auxiliary electrode is formed by the sputtering method or the like. The periphery of the opening of the auxiliary electrode is contacted with the positive electrode 2*a* (which is made of ITO etc.), and some parts of the auxiliary electrode are extended to form the pattern of the above described first feeding electrodes 3*a* which are served for an extracted positive electrode (refer to FIG. 1A, FIG. 2). For example, in a case where the positive electrode 2*a* is formed in a rectangular shape in a plain view, the auxiliary electrode is preferably formed in a rectangular frame shape surrounding the positive electrode 2*a*. In this configuration, the first feeding electrodes 3*a* may be formed of a plurality of rectangular conductive portions which are extended from two sides of the auxiliary electrode, which are the sides parallel with the width directional both sides of the light emitting panel 3, toward the longitudinal direction of the light emitting panel 3 (refer to FIG. 1A). It is preferred that the auxiliary electrode and/or the first feeding electrodes 3*a* is provided thereon with an insulation film (not shown in figures) made of a material having small electric conductivity such as polyimide, epoxy resin or the like, in order to prevent a short circuit between the negative electrode 2*c* and the auxiliary electrode or the first feeding electrodes 3*a*. The first feeding electrode 3*a* (and the auxiliary electrode) is preferably made of metal which has a superior adhesion property with ITO, which has a superior electric conductivity, which is hardly deteriorated by humidity and heat, and which is capable of being bonded through the ultrasonic bonding method. For example, it may be composed of: a three-layers sputtered film of a molybdenum layer, an aluminum layer and a molybdenum layer; an alloy film of silver-palladium-copper; or the like.

Besides, the second feeding electrodes 3b, which are served for an extracted negative electrode, are formed on the substrate 31 in a pattern so as to be contacted with the negative electrode 2c as well as not to be contacted with the positive electrode 2a and the first feeding electrodes 3a. The second feeding electrode 3b can be made of the metal which is recited with regard to the first feeding electrode 3a. The second feeding electrode 3b can be made of the same material with the first feeding electrode 3a. When forming the second feeding electrode 3b, it may be formed as a part of the auxiliary electrode of the negative electrode 2c. These feeding electrodes (3a, 3b) can be formed simultaneously in a same process. After the patterning of them, the light emitting unit 2 (which has the light emitting layer 2b etc.) is formed. It is preferable that the negative electrode 2c of the light emitting unit 2 is electrically connected to the second feeding electrode 3b when forming the negative electrode 2c. Each of these electrodes and the light emitting unit 2 is formed in a thin film having a nanometer size, and can be regarded to have substantially almost no thickness compared with the substrate 31.

As shown in FIG. 1A and FIG. 2, the plurality of feeding electrodes (3a, 3b) are arranged in such a manner that the feeding electrodes (3a, 3b) having same polarity are not arranged adjacent one another. That is, the feeding electrodes (3a, 3b) of a same polarity are arranged in distant positions with one another. Therefore, the power feeding points are dispersed in positions, it enables to equalize the applying voltage in plain to the light emitting unit 2. As a result, the dispersion of brightness can be reduced.

As shown in FIG. 1A, the sealing member 32 is bonded to be fixed to the substrate 31 so as to cover the light emitting unit 2 and the like with exposing the feeding electrodes (3a, 3b). The sealing member 32 is formed of a copper foil without pinhole, which has a superior sealing property. The sealing member 32 is fixed to the substrate 31 via a non-conductive adhesive such as epoxy resin, silicone resin, or the like. Thereby, an insulation section (not shown in figures) made of the non-conductive adhesive is formed between the sealing member 32 and the light emitting unit 2, and therefore the sealing member 32 is made to be contactless with the light emitting unit 2. This configuration makes it possible to prevent a short circuit between the sealing member 32 and the light emitting unit 2.

As shown in FIG. 4, the circuit board 4 and the land-board 6 is connected by bonding the wirings 7, and the land-board 6 and the feeding electrodes (3a, 3b) are connected by bonding the wirings 8. Each of the wirings (7, 8) is preferably formed of a pure aluminum wire. The pure aluminum wire can be connected to each of the terminals in a short time under an ordinary temperature by way of the ultrasonic bonding method. Size (diameter) of each of the wirings (7, 8) is determined according to the material, consumption current and the like of the light emitting panel 3.

Figure 5:
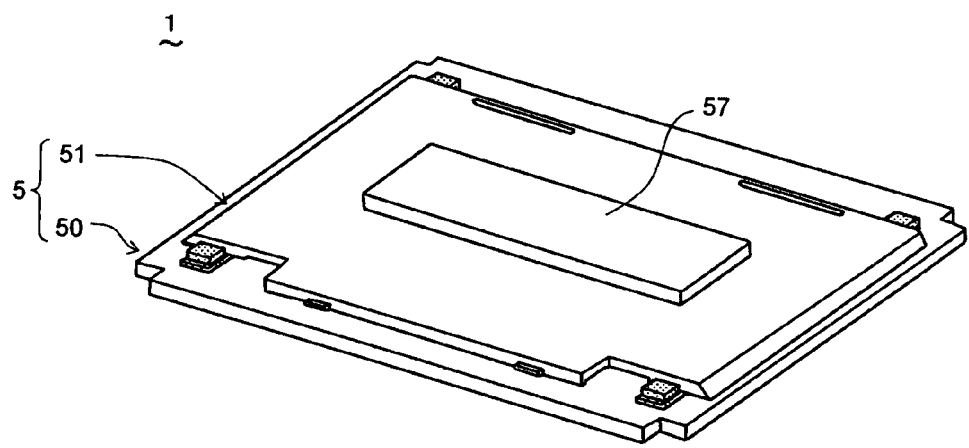
FIG. 5 is a perspective view of the light emitting module.

In the above light emitting module 1, each of the wirings 8, which connects between the feeding electrode (3a, 3b) and the land-board 6, is arranged so as to be elongated in the direction from the center region of the light emitting panel 3 to the peripheral region of the light emitting panel 3. Therefore, the top portion of the wiring 8 is located nearer the center in relation to the peripheral region of the light emitting panel 3. With this configuration, the wiring 8 becomes less possible to be contacted with the inner surface of the cover 51 even when using the cover 51 having a chamfered periphery. Therefore, the present embodiment can employ such the cover 51 having chambered periphery as shown in FIG. 5, can suppress the thickness impression of the light emitting module 1, and can provide the light emitting module 1 of a streamlined shape.

As shown in FIG. 1A, in the light emitting module 1, the circuit components 41 mounted on the circuit board 4 are arranged so as to be gathered at a center region of the light emitting panel 3. With this configuration, although the center region of the light emitting module 1 may becomes thick, the other region thereof can be made thin as shown in FIG. 5. Therefore, the module itself can be formed in a streamlined shape. In addition, electric wirings for connecting between a plurality of the light emitting modules 1 can be arranged at the outward space of the "thinned-region" of the light emitting module 1. Therefore, this configuration enables to increase the degree of freedom in the design of illumination apparatus to which the light emitting module 1 is attached.

In the present embodiment, the land-board 6 is arranged nearer the center in relation to the feeding electrodes (3a, 3b) (that is, in relation to the openings 54). In addition, in the present embodiment, the feeding electrodes (3a, 3b) are electrically connected to the circuit board 4 via the land-board 6 (refer to FIG. 2). Therefore, the length of the wiring 8 can be shortened by locating the land-board 6 near the feeding electrodes (3a, 3b). With this configuration, expansion/contraction amount of the wiring 8 caused by the heat of the circuit board 4 etc. can be minimized, and therefore the thermal stress applied on the connection point and the wiring 8 can be minimized. Therefore, this configuration enables to suppress the occurrence of the breaking of the wiring 8. Further, in the present embodiment, the circuit board 4 and the land-board 6 are arranged separately, and they are connected by the wiring 7. With this configuration, the wiring 8, which connects between the land-board 6 and the feeding electrodes (3a, 3b), is hardly affected by the thermal expansion/contraction of the circuit board 4. Therefore, this configuration enables to suppress the occurrence of the breaking of the wiring 8.

In the present embodiment, the light emitting panel 3 is attached to the supporting portion 53 on the front side surface (on the surface of the emitting directional side), and the circuit board 4 is attached to the supporting portion 53 on the back side surface (on the surface of the non-emitting directional side) in the case body 50. This configuration enables to reliably insulate between the light emitting unit 2 of the light emitting panel 3 and the circuit board 4. Further, this configuration enables to make the light emitting module 1 in a compact size. The supporting portion 53 of the case body 50 is formed with the openings 54 at positions each of which corresponds to the position of the feeding electrode (3a, 3b) of the light emitting panel 3. The wiring 8 is extended from the feeding electrode (3a, 3b) so as to pass through one of the openings 54 which is formed for the concerned feeding electrode (3a, 3b). This configuration enables to prevent from occurring a short circuit between the first feeding electrode 3a and the second feeding electrode 3b.

Figure 6:
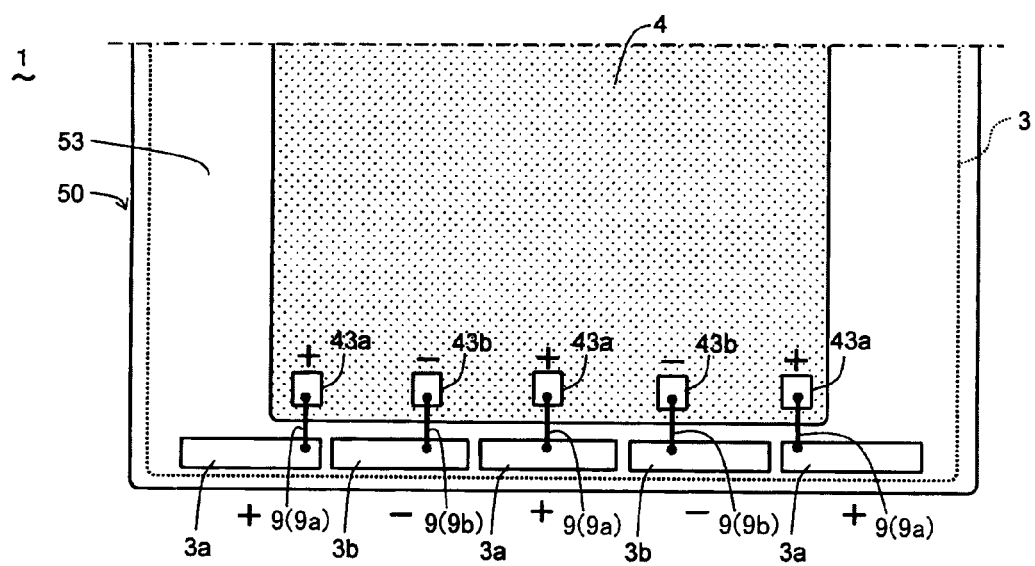
FIG. 6 is a schematic top view showing around a peripheral region of a modified example of the light emitting module.
Figure 7:
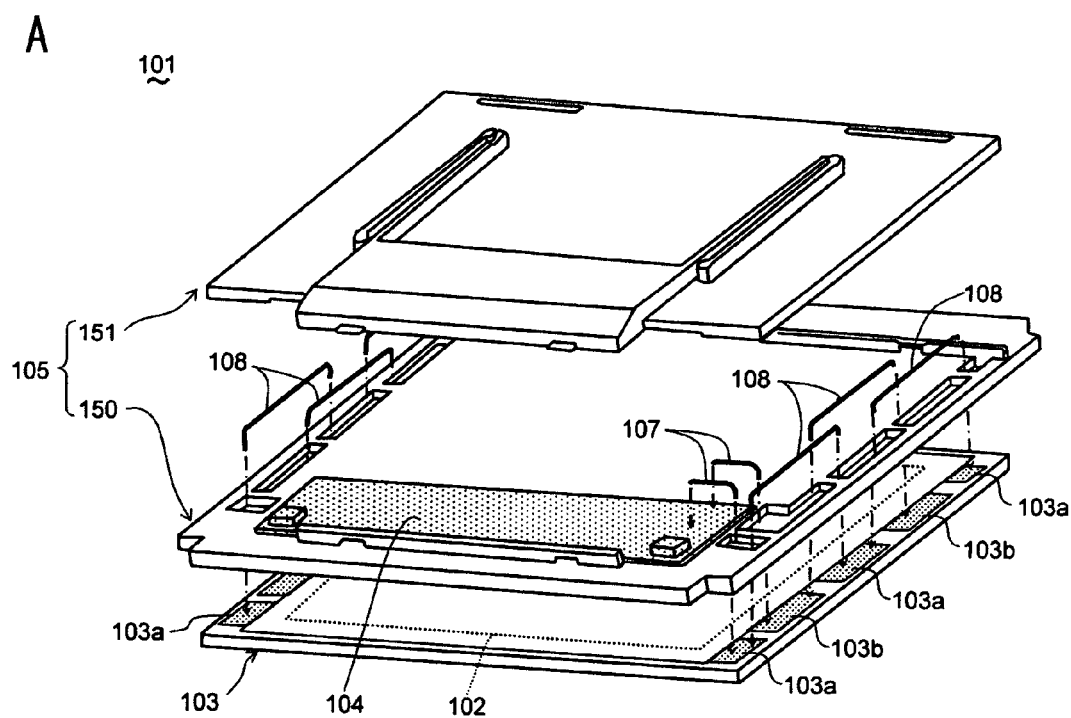
FIG. 7A is an exploded perspective view of a conventional light emitting module.
FIG. 7B is a schematic top view showing around a peripheral region of the conventional light emitting module.
Figure 7:
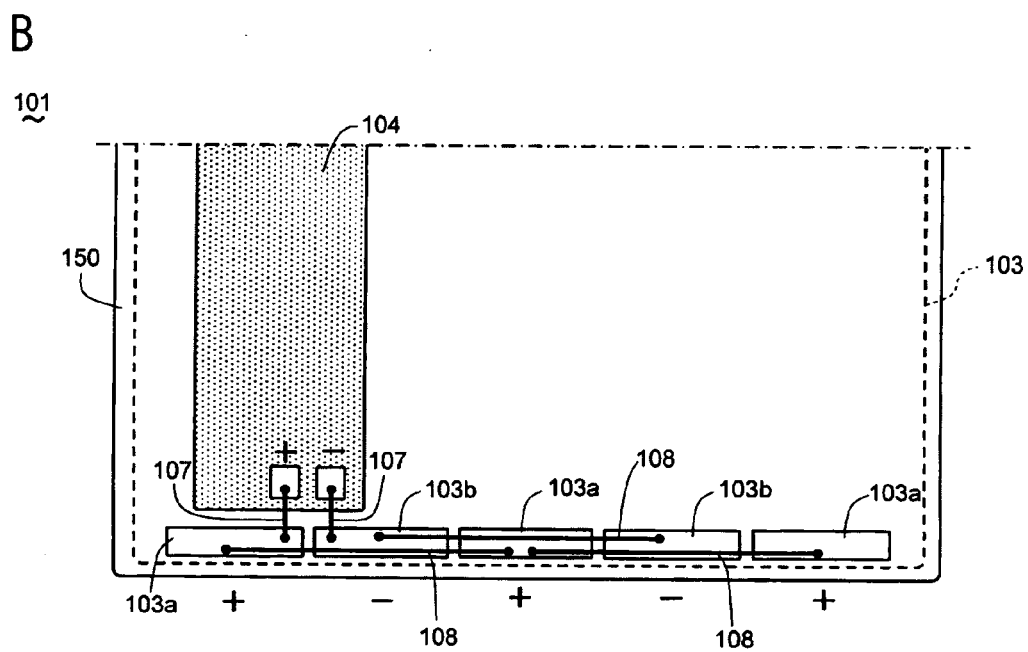
Figure 8:
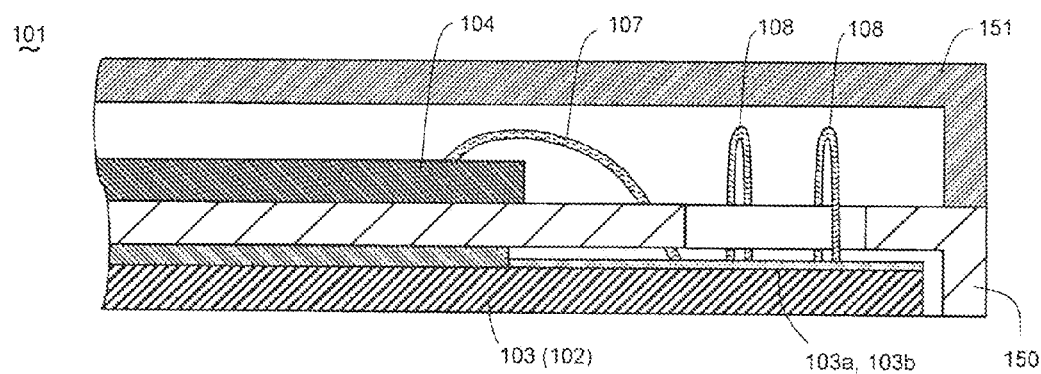
FIG. 8A and FIG. 8B are schematic sectional side views showing around a peripheral region of conventional light emitting modules.
Figure 8:
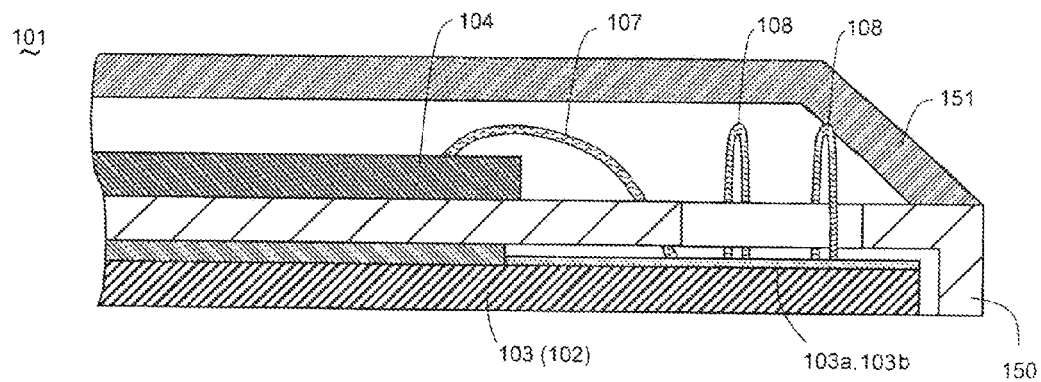

Next, a modified example of the light emitting module of the present embodiment is described with reference to FIG. 6. In the light emitting module 1 of this modified example, a patterned circuit (not shown in figures) is formed on the circuit board 4. The patterned circuit is arranged in parallel with the feeding electrodes (3a, 3b). The feeding electrode (3a, 3b) is electrically connected directly to the circuit board 4 by a wiring 9. Herein, the circuit board 4 is provided with terminals (43a, 43b) for connecting the wirings 9. That is, the first feeding electrode 3a is electrically connected to the positive side terminal 43a of the circuit board 4 by a wiring 9a, and the second feeding electrode 3b is electrically connected to the negative side terminal 43b of the circuit board 4 by a wiring 9b. In this example, each of the wirings 9 (9a, 9b) is elongated in the direction from the center region to the peripheral region of the light emitting panel 3, as similar with the above described (refer to FIG. 2) wirings 8. Each of the wirings 9 (9a, 9b) is extended from the feeding electrode (3a, 3b) so as to pass through one of the openings 54 which is formed for the feeding electrode (3a, 3b) in question. Other configurations are similar with those of above described embodiment.

With this configuration, there is no need to fix a plurality of substrates to the case body and electrically connect therebetween when producing the module. That is, this configuration enables to simplify the working process and to improve the productivity of the module.

The present invention is not limited to the above described embodiment and can be applied with a various of modification, so long that the feeding electrodes are arranged along the periphery of the light emitting panel and that the feeding electrode is connected to the circuit board by the wiring which is elongated from the center region to the peripheral region of the light emitting panel. For example, although the feeding electrodes (3a, 3b) are formed at the longitudinal both ends of the light emitting panel 3 in the above described embodiment, the feeding electrodes also can be formed at both ends of a direction orthogonal to the embodiment (that is, formed at the width directional both ends of the light emitting panel 3; not shown in figures). For example, a plurality of feeding electrodes can be arranged along the longitudinal direction of the light emitting panel 3. Further, a land-board can be provided near these feeding electrodes.

The invention claimed is:

1. A light emitting module comprising:
   a light emitting panel which has a light emitting unit and a plurality of feeding electrodes, said light emitting unit comprising a positive electrode, a negative electrode and a light emitting layer provided therebetween, each of said plurality of feeding electrodes being electrically connected to either said positive electrode or said negative electrode;
   a circuit board which is electrically connected to said plurality of feeding electrodes and is configured to supply electric power to said light emitting unit; and
   a case unit in which said light emitting panel and said circuit board are housed,
   wherein said plurality of feeding electrodes are arranged at a peripheral region of said light emitting panel,
   wherein said circuit board is arranged nearer the center in relation to the peripheral region of said light emitting panel,
   wherein the electrical connection between said feeding electrode and said circuit board is obtained by a wiring which is elongated in the direction from a center region to a peripheral region of said light emitting panel,
   wherein said light emitting module further comprises a land-board for wiring connection, said land-board being arranged nearer the center in relation to said plurality of feeding electrodes, and
   wherein the electrical connection between said feeding electrode and said circuit board is obtained via said land-board.

2. The light emitting module as set forth in claim 1, wherein said plurality of feeding electrodes are arranged in such a manner that the feeding electrodes having same polarity are not arranged adjacent one another.

3. The light emitting module as set forth in claim 1 wherein circuit components are mounted on said circuit board, said circuit components being arranged so as to be gathered at a center region of said light emitting panel.

4. The light emitting module as set forth in claim 1, wherein said circuit board and said land-board are arranged separately from each other.

5. A light emitting module comprising:
   a light emitting panel which has a light emitting unit and a plurality of feeding electrodes, said light emitting unit comprising a positive electrode, a negative electrode and a light emitting layer provided therebetween, each of said plurality of feeding electrodes being electrically connected to either said positive electrode or said negative electrode;
   a circuit board which is electrically connected to said plurality of feeding electrodes and is configured to supply electric power to said light emitting unit; and
   a case unit in which said light emitting panel and said circuit board are housed,
   wherein said plurality of feeding electrodes are arranged at a peripheral region of said light emitting panel,
   wherein said circuit board is arranged nearer the center in relation to the peripheral region of said light emitting panel,
   wherein the electrical connection between said feeding electrode and said circuit board is obtained by a wiring which is elongated in the direction from a center region to a peripheral region of said light emitting panel,
   wherein said plurality of feeding electrodes are arranged along a side of said light emitting panel, and
   wherein said plurality of feeding electrodes and said circuit board are electrically connected by a plurality of said wirings, each of said plurality of wirings being elongated in the direction orthogonal to the arrangement direction of said plurality of feeding electrodes.

6. The light emitting module as set forth in claim 5,
   wherein said case unit comprises a case body to which said light emitting panel and said circuit board are attached, said case body being formed with a plurality of openings at positions corresponding to said plurality of feeding electrodes of said light emitting panel,
   wherein said circuit board is arranged on said case body of a reverse side to a side to which said light emitting panel is attached, said circuit board being arranged nearer the center in relation to said plurality of openings, and
   wherein each of wirings which are connected to the feeding electrodes is arranged so as to pass through one of said plurality of openings which is formed for the feeding electrode in question.

7. The light emitting module as set forth in claim 6,
   wherein said light emitting module further comprises a land-board for wiring connection, said land-board being arranged on said case body of a side to which said circuit board is attached, said land-board being arranged nearer the center in relation to said plurality of openings,
   wherein each of said plurality of feeding electrodes is electrically connected to said land-board by a wiring, said wiring being elongated in the direction orthogonal to the arrangement direction of said plurality of feeding electrodes, said wiring being arranged so as to pass through one of said plurality of openings which is formed for the feeding electrode in question, and
   wherein said land-board is electrically connected to said circuit board by a wiring which is elongated in the direction orthogonal to the arrangement direction of said plurality of feeding electrodes.

8. The light emitting module as set forth in claim 1, wherein said light emitting unit is an electroluminescence device which comprises a planar positive electrode, a planar negative electrode and a light emitting layer provided therebetween.

9. The light emitting module as set forth in claim 2, wherein circuit components are mounted on said circuit board, said circuit components being arranged so as to be gathered at a center region of said light emitting panel.

* * * * *